United States Patent
Cha et al.

(10) Patent No.: US 8,072,580 B2
(45) Date of Patent: Dec. 6, 2011

(54) MASKLESS EXPOSURE APPARATUS AND METHOD OF MANUFACTURING SUBSTRATE FOR DISPLAY USING THE SAME

(75) Inventors: Sang Hwan Cha, Seoul (KR); Soo Hoa Jeong, Seoul (KR)

(73) Assignee: LG Electronics Inc., Seoul (KR)

( * ) Notice: Subject to any disclaimer, the term of this patent is extended or adjusted under 35 U.S.C. 154(b) by 383 days.

(21) Appl. No.: 11/867,725

(22) Filed: Oct. 5, 2007

(65) Prior Publication Data

US 2008/0084548 A1    Apr. 10, 2008

(30) Foreign Application Priority Data

Oct. 9, 2006    (KR) .................. 10-2006-0098088

(51) Int. Cl.
  *G03B 27/54*    (2006.01)
  *G03B 27/42*    (2006.01)
(52) U.S. Cl. ........................... 355/67; 355/53
(58) Field of Classification Search .............. 355/52, 355/53, 55, 67
See application file for complete search history.

(56) References Cited

U.S. PATENT DOCUMENTS

| | | | | |
|---|---|---|---|---|
| 5,589,869 | A | * | 12/1996 | Brandt et al. ................ 347/212 |
| 6,717,650 | B2 | * | 4/2004 | Jain ............................... 355/53 |
| 7,133,121 | B2 | * | 11/2006 | Bleeker et al. ............... 355/77 |
| 7,271,877 | B2 | * | 9/2007 | Fries ............................. 355/67 |
| 7,372,547 | B2 | * | 5/2008 | Eib et al. ...................... 355/67 |
| 7,618,751 | B2 | * | 11/2009 | Sandstrom et al. ........... 430/5 |

FOREIGN PATENT DOCUMENTS

JP    2003-195512    7/2003

* cited by examiner

*Primary Examiner* — Hung Henry Nguyen
(74) *Attorney, Agent, or Firm* — Fish & Richardson P.C.

(57) ABSTRACT

The present invention relates to a maskless exposure apparatus and a method of manufacturing a substrate for a display using the same. In the present invention, a substrate 22 is disposed on a scan stage 20 that can be moved in horizontal and vertical directions. Meanwhile, an optical unit 30 for generating light available for exposure is disposed above the substrate 22. Light that has passed though the optical unit 30 is transferred to a DMD unit 40. The DMD unit 40 is provided with DMDs 42 for selectively reflecting the light to form a pattern on the substrate 22. The DMDs 42 are arranged in a plurality of rows in such a manner that DMDs 42 in the same row are spaced apart by a predetermined distance from each other and DMDs 42 in different rows partially overlap with each other at one end portions thereof. Thus, when the DMDs 42 scan the substrate 22, scan marks 62 are produced discontinuously in two straight lines. According to the present invention constructed as above, the scan marks are produced discontinuously on the substrate during exposure of the substrate, so that a user cannot recognize the presence of the scan marks when watching a display.

9 Claims, 4 Drawing Sheets

MASKLESS EXPOSURE APPARATUS AND METHOD OF MANUFACTURING SUBSTRATE FOR DISPLAY USING THE SAME

BACKGROUND OF THE INVENTION

1. Field of the Invention

The present invention relates to a maskless exposure apparatus, and more particularly, to a maskless exposure apparatus in which digital micro-mirror devices (DMDs) for performing exposure to a liquid crystal display (LCD) panel are arranged in an overlapping fashion and a method of manufacturing a substrate for a display using the same.

2. Description of the Related Art

In general, a panel constituting a flat panel display (FPD) is patterned by the following process. First, a patterning material is applied to a panel and selectively exposed to light using a photomask. A portion of the patterning material, which is changed in chemical properties by the selective exposure, or the other portion thereof is selectively removed to form a pattern.

Recently, a maskless exposure apparatus without using a photomask has been widely used. The maskless exposure apparatus employs a method in which an electronic device is used to transfer a light beam to a panel using pattern information in the form of electric signals. A typical example of the electronic device is a DMD. The DMD employs a principle that a plurality of micro-mirrors cause light, which is incident at a certain angle, to be reflected at a desired angle and the other light to be reflected at different angles, thereby forming a scene using only necessary light.

FIG. 1 is a schematic view illustrating the configuration of a conventional maskless exposure apparatus.

As illustrated in FIG. 1, a light source 1 provides light for an exposure process. The light from the light source 1 is transferred to a DMD 5 via a first optical system 3. The first optical system 3 includes a light guiding member 3' and a condensing optical member 4. The light guiding member 3' guides the light to a desired path, and the condensing optical member 4 makes the light from the light source 1 available for exposure.

The light that has passed through the condensing optical member 4 is reflected on the DMD 5. Here, the DMD 5 receives desired pattern information according to external signals and selectively transfers only necessary light to a second optical system 7 that will be described later. That is, among the light from the light source 1, the DMD 5 transfers only necessary light to the second optical system 7 while reflecting unnecessary light at other angles.

The second optical system 7 is provided with a light guiding member 7' and an image optical member 8, which function to guide the light from the DMD 5. The light guiding member 7' functions to guide the light to a desired path, and the image optical member 8 irradiates a substrate 10 with the light.

FIG. 2 is a schematic view illustrating a scanning process performed by DMDs of a conventional maskless exposure apparatus.

As illustrated in the figure, a substrate 10 is disposed on a scan stage 11. The scan stage 11 can be moved by an external driving source in X- and Y-axis directions, and the substrate 10 is irradiated with light.

DMDs 5 that irradiate the substrate 10 with light are placed above the scan stage 11. Generally, the DMDs 5 are arranged in a direction perpendicular to a scanning direction, as illustrated in FIG. 2. The DMDs 5 irradiate the substrate 10 with light according to pattern information while moving in a direction designated by an arrow. For reference, the scanning is performed by not a movement of the DMDs 5 itself but a relative movement of the DMDs 5 as the scan stage 11 is moved.

The number of the DMDs 5 is not limited to that illustrated in FIG. 2, but a larger number of DMDs 5 may be arranged to perform the scanning. The DMDs 5 generally perform the scanning several times rather than once. In other words, as illustrated in FIG. 2, the DMDs 5 perform the scanning while linearly reciprocating in the Y-axis direction.

However, the conventional maskless exposure apparatus described above has the following problems.

When the DMDs 5 perform the scanning, a pattern 15 is formed on the substrate 10, as shown in FIG. 3. At this time, scan marks 17 are produced in the pattern 15 due to the arrangement fashion of the DMDs 5. That is, when the DMDs 5 perform the scanning, the scan marks 17 are produced along both lateral sides and scanning boundaries of the DMDs 5. Thus, in FIG. 2, the scan marks 17 are produced along four straight lines.

Since the scan marks 17 directly appear on a screen when the substrate 10 is used for a display, there is a problem in that inconvenience is caused to a user who watches the display. That is, the scan marks 17 become a factor that deteriorates the quality of an image.

SUMMARY OF THE INVENTION

Accordingly, the present invention is conceived to solve the aforementioned problems in the prior art. An object of the present invention is to provide a maskless exposure apparatus that dose not produce a scan mark on a substrate when the substrate is exposed to light, and a method of manufacturing a substrate for a display using the same.

According to one aspect of the present invention for achieving the object, there is provided a maskless exposure apparatus, comprising an optical unit for generating light available for exposure; and a digital micro-mirror device (DMD) unit including DMDs for selectively reflecting the light transferred from the optical unit to irradiate a substrate with the light, wherein the DMDs are arranged in a plurality of rows in such a manner that DMDs in the same row are spaced apart by a predetermined distance from each other and DMDs in different rows partially overlap with each other at one end portions thereof.

When the DMDs perform scanning, both lateral ends of moving paths of the DMDs may partially overlap with each other.

The substrate may be disposed on a scan stage that can be moved in X- and Y-axis directions.

The substrate may be used to form a liquid crystal display.

According to another aspect of the present invention, there is provided a method of manufacturing a substrate for a display including a maskless exposing process, comprising the steps of arranging DMDs in a plurality of rows in such a manner that DMDs in the same row are spaced apart by a predetermined distance from each other and DMDs in different rows partially overlap with each other at one end portions thereof; relatively moving the DMDs to expose a substrate; aligning the DMDs such that both lateral ends of moving paths of the DMDs partially overlap with each other after the exposure performed by the DMDs is completed; and relatively moving the DMDs to expose the substrate.

The step of aligning the DMDs such that both lateral ends of moving paths of the DMDs partially overlap with each other and the step of relatively moving the DMDs to expose the substrate may be performed repeatedly every time the exposure is completed.

The substrate may be disposed on a scan stage that can be moved in X- and Y-axis directions.

The substrate may be used to form a liquid crystal display.

BRIEF DESCRIPTION OF THE DRAWINGS

The above and other objects, features and advantages of the present invention will become apparent from the following description of a preferred embodiment given in conjunction with the accompanying drawings, in which.

DESCRIPTION OF THE PREFERRED EMBODIMENTS

Hereinafter, preferred embodiments of a maskless exposure apparatus and a method of manufacturing a substrate for a display using the same according to the present invention will be described in detail with reference to the accompanying drawings.

Figure 1:
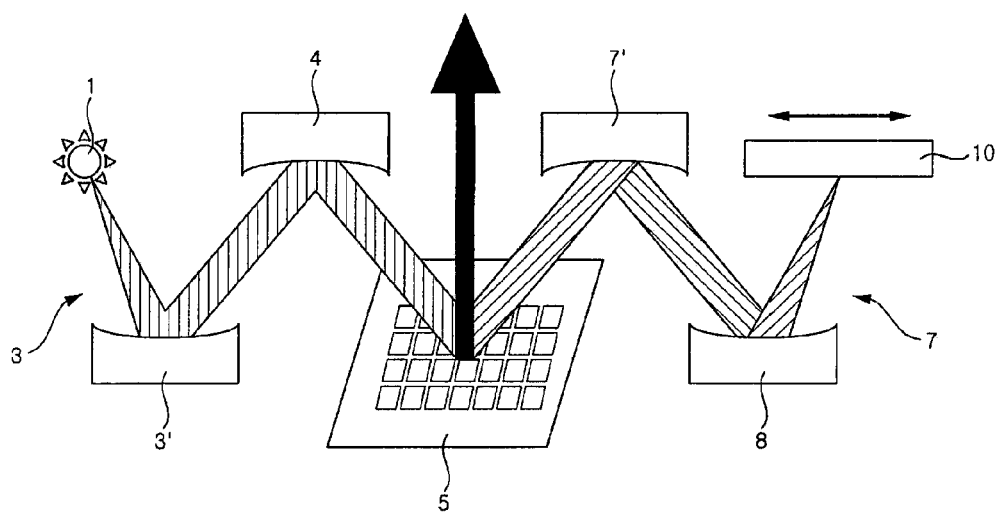
FIG. 1 is a schematic view illustrating the configuration of a conventional maskless exposure apparatus.
Figure 2:
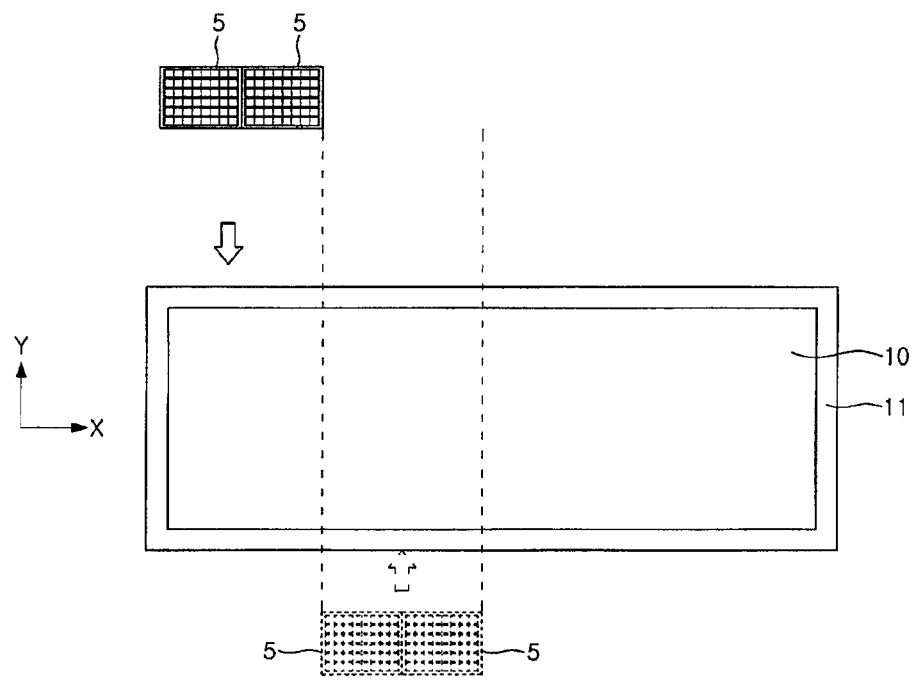
FIG. 2 is a schematic view illustrating a scanning process performed by DMDs of a conventional maskless exposure apparatus.
Figure 3:
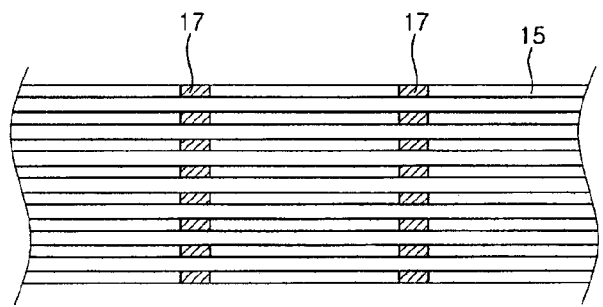
FIG. 3 is a plan view schematically illustrating a pattern formed by the conventional maskless exposure apparatus.
Figure 4:
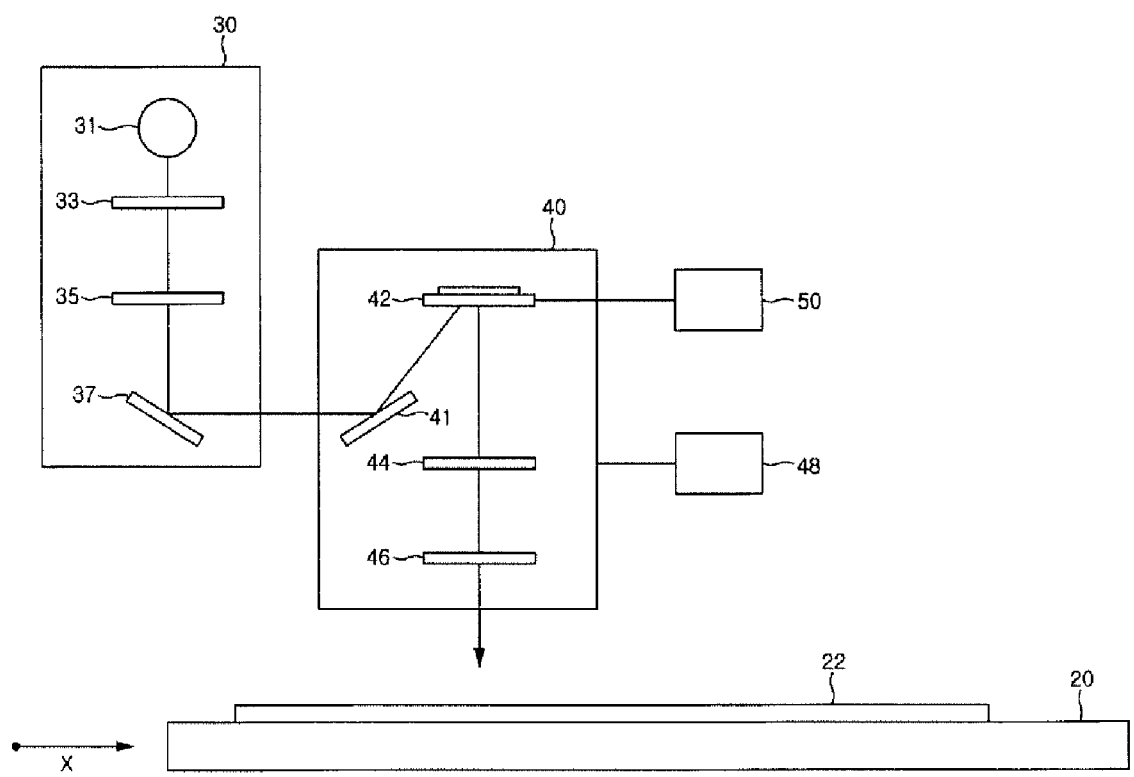
FIG. 4 is a side view schematically illustrating the configuration of a maskless exposure apparatus according to a preferred embodiment of the present invention.
Figure 5:
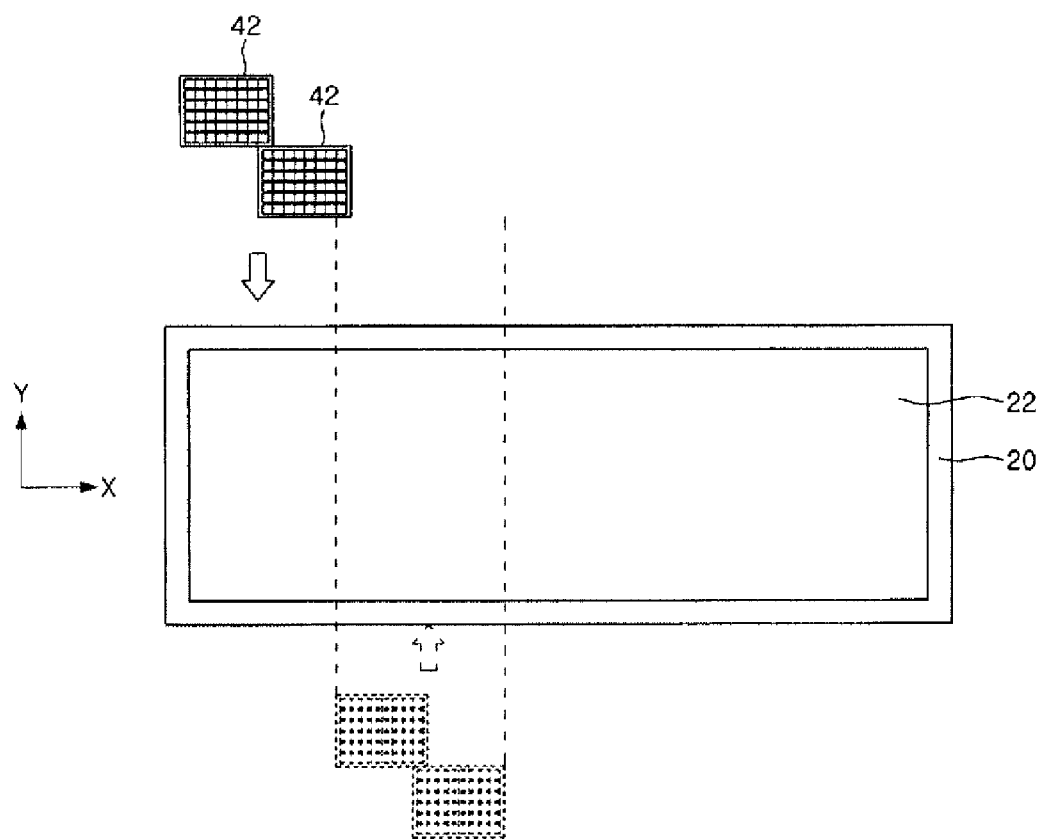
FIG. 5 is a schematic view illustrating a scanning process performed by DMDs of the maskless exposure apparatus according to the preferred embodiment of the present invention.

FIG. 4 is a side view schematically illustrating the configuration of a maskless exposure apparatus according to a preferred embodiment of the present invention, and FIG. 5 is a plan view illustrating the configuration of main portions of the maskless exposure apparatus according to the preferred embodiment of the present invention.

As illustrated in these figures, a substrate 22 to be processed is disposed on a scan stage 20. The substrate 22 can be moved along with the scan stage 20 while being seated on the scan stage 20. That is, when the scan stage 20 is moved in X- and Y-axis directions, the substrate 22 is also moved along with the scan stage 20.

An optical unit 30 for providing light available for exposure, and a DMD unit 40 that receives the light from the optical unit 30 and irradiates the substrate 22 with the light are provided above the scan stage 20.

The optical unit 30 includes a light source 31 for providing light required for exposure. Laser diodes may be used for the light source 31. Light emitted from the light source 31 is distributed while passing through a fly-eye lens 33. Then, the light that has passed through the fly-eye lens 33 is radiated parallel while passing through a condenser lens 35.

The light that has passed through the condenser lens 35 is reflected on a guide mirror 37 so that a path thereof can be changed. Then, the light reflected on the guide mirror 37 is transferred to the DMD unit 40.

The DMD unit 40 selectively irradiates the substrate 22 with the light transferred from the optical unit 30. The DMD unit 40 is provided with DMDs 42 that selectively reflect light without using an additional mask. Each of the DMDs has a plurality of micro-mirrors arranged to adjust their angles and reflects light while changing the angles of the respective micro-mirrors.

Referring to FIG. 5, the DMDs 42 are arranged in two rows and DMDs 42 in the same row are spaced apart by a certain distance from each other. Although FIG. 5 illustrates only one DMD 42 in each of the rows, a plurality of DMDs 42 may be disposed at regular intervals in every row. The DMDs 42 perform scanning while linearly reciprocating in the Y-axis direction with respect to the substrate 22.

That is, the DMDs 42 scan the substrate 22 several times rather than once. As described above, the DMDs 42 themselves are not moved but are relatively moved as the scan stage 20 is moved in the X- and Y-axis directions. The reason is that if the DMDs 42 themselves are moved, they are rattled, resulting in deterioration of exposure efficiency.

DMDs 42 in different rows are arranged to partially overlap with each other at their one end portions. It is preferred that the DMDs 42 overlap with each other to a minimal extent. This is to minimize the number of the DMDs 42 required for scanning the substrate 22. However, if the overlapping end portions of the DMDs 42 in the different rows are too small, scan marks 62 that will be explained later may be formed in a nearly straight line. Thus, it is necessary to properly adjust the size of the overlapping portions.

The light from the optical unit 30 is reflected on the guide mirror 41 provided in the DMD unit 40 and then transferred to the DMDs 42. The DMDs 42 selectively reflect the light by means of the respective micro-mirrors according to inputted pattern information.

The light reflected on the DMDs 42 is decreased or increased in size while passing through a projection lens 44 disposed below the DMDs 42. The light that has passed through the projection lens 44 passes through a focusing lens 46 and is then radiated onto the substrate 22.

The DMD unit 42 is provided with a DMD adjusting device 48 that adjusts the position of the DMDs 42. Although not shown in the figures, the DMD adjusting device 48 includes an X-axis micrometer and a Y-axis micrometer. The movements of the DMDs 42 in the X- and Y-axis directions are controlled by the X-axis micrometer and the Y-axis micrometer, respectively.

Meanwhile, the DMD unit 40 is connected to a pattern information transmitting unit 50. The pattern information transmitting unit 50 transmits information on a pattern to be formed on the substrate 22 to the DMDs 42. Then, the DMDs 42 reflect light corresponding to the pattern input from the pattern information transmitting unit 50, thereby forming the pattern on the substrate 22.

Hereinafter, the maskless exposure apparatus according to the present invention constructed as above and a method of manufacturing a substrate for a display using the same will be described in detail.

Figure 6:
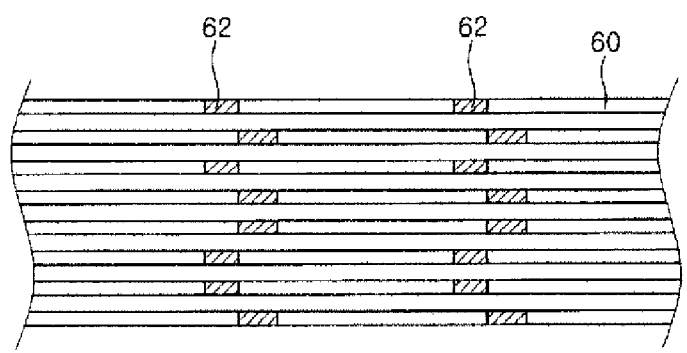
FIG. 6 is a plan view schematically illustrating a pattern formed by the maskless exposure apparatus according to the preferred embodiment of the present invention.

FIG. 5 is a schematic view illustrating a scanning process performed by DMDs of the maskless exposure apparatus according to the preferred embodiment of the present invention, and FIG. 6 is a plan view schematically illustrating a pattern formed by the maskless exposure apparatus according to the preferred embodiment of the present invention.

As shown in FIGS. 5 and 6, the DMDs 42 are arranged in two rows. When the DMDs 42 perform scanning, a pattern 60 is formed on the substrate 22. At this time, scan marks 62 are formed in the pattern 60 along the both lateral sides of the DMDs 42. Specifically, when a first scan is performed in FIG.

5, the scan marks 62 are formed in four straight lines along the both lateral sides of the DMDs 42.

Next, a second scan performed as indicated by a dotted line in FIG. 5 will be described. When the first scan by is completed, the DMDs 42 are moved in a positive X-axis direction. At this time, the DMDs 42 are moved such that moving paths of the DMDs 42 partially overlap with each other. This is to discontinuously form the scan marks 62 that are to be produced at both lateral sides of the moving paths when the DMDs 42 perform the scanning. The moving paths preferably overlap as much as the overlapping extent of the DMDs 42 disposed in different rows. In this manner, the DMDs 42 perform the scanning while being relatively moved in the X- and Y-axis directions.

Here, since the DMDs 42 selectively irradiate the substrate with light, the scan marks 62 are formed at predetermined intervals along the scanning direction of the DMDs 42, as shown in FIG. 6. Therefore, the scan marks 62 are not formed continuously in a straight line along the Y-axis direction but are formed discontinuously in two straight lines.

In the state where the scan marks 62 have been formed as above, a display is completed and a user then watches the display. When the scan marks 62 are formed discontinuously in two straight lines as described above, the user cannot recognize the scan marks 62. That is, the user cannot recognize the presence of the scan marks 62 formed on the display while watching the display. The user watches the display while regarding the image quality as having no problem.

The scope of the present invention is not limited to the embodiments described and illustrated above but is defined by the appended claims. It will be apparent that those skilled in the art can make various modifications and changes thereto within the scope of the invention defined by the claims.

For example, the scanning is not necessarily performed by the DMDs 42 disposed in two rows as described above, and the DMDs 42 may be arranged in a larger number of rows to perform the scanning while irradiating the substrate 22 with light. Although not specifically mentioned herein, the substrate used with the present invention may be a substrate for use in an LCD, a plasma display, an organic light emitting diode display, a flexible display and the like.

The exposing process is generally involved in a series of processes of applying, exposing and developing photoresist, etching an object on the photoresist, and removing the photoresist. The present invention proposes an apparatus and method involved in the exposing process.

In the present invention, in order to form a pattern on a substrate, DMDs for selectively reflecting light emitted from a light source are arranged in a plurality of rows in such a manner that DMDs disposed in different rows partially overlap with each other. Thus, when the DMDs perform scanning while selectively reflecting the light, scan marks are produced discontinuously in two straight lines along boundaries of the DMDs. Thus, according to the present invention, there is advantage in that when a user watches a display having a substrate with the scan marks produced thereon, the user cannot recognize the scan marks.

That is, there is an advantage in that the scan marks discontinuously formed on the display are not visible to the eyes of the user so that the user can comfortably watch the display.

What is claimed is:

1. A maskless exposure apparatus, comprising:
   an optical unit for generating light available for exposure; and
   a digital micro-mirror device (DMD) unit including a first row of DMDs and a second row of DMDs, each of the first row of DMDs and the second row of DMDs being configured to selectively reflect the light transferred from the optical unit to irradiate a substrate with the light,
   wherein each of the DMDs in the first row of DMDs is spaced apart from adjacent DMDs in the first row of DMDs by a predetermined distance and each of the DMDs in the second row of DMDs is spaced apart from adjacent DMDs in the second row of DMDs by a predetermined distance, and
   wherein each of the DMDs in the first row of DMDs only partially overlaps any one DMD of the second row of DMDs.

2. The maskless exposure apparatus as claimed in claim 1, wherein the maskless exposure apparatus is configured to scan the substrate relative to the DMD unit along a plurality of paths, a first of the plurality of paths and a second of the plurality of paths being aligned such that a position of a DMD of the first row of DMDs scanned along the first of the plurality of paths partially overlaps a position of a DMD of the second row of DMDs scanned along the second of the plurality of paths.

3. The maskless exposure apparatus as claimed in claim 1 or 2, wherein the substrate is disposed on a scan stage that can be moved in X- and Y-axis directions.

4. The maskless exposure apparatus as claimed in claim 3, wherein the substrate is used to form a liquid crystal display.

5. A method of manufacturing a substrate for a display, including a maskless exposing process, the method comprising:
   exposing a substrate to light utilizing a digital micro-mirror device (DMD) unit, the DMD unit including a first row of DMDs and a second row of DMDs, each of the first row of DMDs and the second row of DMDs being configured to selectively reflect the light to irradiate the substrate with the light; and
   concurrent with exposing the substrate to light utilizing the DMD unit, moving the substrate relative to the DMD unit, wherein each of the DMDs in the first row of DMDs is spaced apart from adjacent DMDs in the first row of DMDs by a predetermined distance and each of the DMDs in the second row of DMDs is spaced apart from adjacent DMDs in the second row of DMDs by a predetermined distance, and
   wherein each of the DMDs in the first row of DMDs only partially overlaps any one DMD of the second row of DMDs.

6. The method as claimed in claim 5, wherein the substrate is disposed on a scan stage that can be moved in X- and Y-axis directions.

7. The method as claimed in claim 6, wherein the substrate is used to form a liquid crystal display.

8. The method of claim 5, wherein moving the substrate relative to the DMD unit includes moving the substrate relative to the DMD unit along a plurality of paths, a first of the plurality of paths and a second of the plurality of paths being aligned such that a position of a DMD of the first row of DMDs moved along the first of the plurality of paths partially overlaps a position of a DMD of the second row of DMDs moved along the second of the plurality of paths.

9. A method of manufacturing a substrate for a display, including a maskless exposing process, the method comprising:
   exposing a substrate to light utilizing a digital micro-mirror device (DMD) unit, the DMD unit including a first row of DMDs and a second row of DMDs, each of the first row of DMDs and the second row of DMDs being configured to selectively reflect the light to irradiate the substrate with the light; and concurrent with exposing the substrate to light utilizing the DMD unit, moving the substrate relative to the DMD unit to form scan marks in a plurality of discontinuous straight lines on a surface of the substrate through the exposure of the substrate with the light, wherein each of the DMDs in the first row of DMDs is spaced apart from adjacent DMDs in the first row of DMDs by a predetermined distance and each of the DMDs in the second row of DMDs is spaced apart from adjacent DMDs in the second row of DMDs by a predetermined distance, and wherein each of the DMDs in the first row of DMDs only partially overlaps any one DMD of the second row of DMDs.

* * * * *